(12) United States Patent
Kishida et al.

(10) Patent No.: US 8,123,882 B2
(45) Date of Patent: Feb. 28, 2012

(54) PROCESS FOR PRODUCING CERAMIC SUBSTRATE

(75) Inventors: Kazuo Kishida, Otsu (JP); Hiroaki Yamada, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/888,450

(22) Filed: Sep. 23, 2010

(65) Prior Publication Data

US 2011/0011516 A1 Jan. 20, 2011

Related U.S. Application Data

(63) Continuation of application No. PCT/JP2009/052846, filed on Feb. 19, 2009.

(30) Foreign Application Priority Data

Mar. 25, 2008 (JP) .................................. 2008-077398

(51) Int. Cl.
 *B29C 65/00* (2006.01)
 *C03B 29/00* (2006.01)
(52) U.S. Cl. ...................... 156/77; 156/89.11; 156/89.12
(58) Field of Classification Search ............... 156/89.11, 156/89.12, 77
 See application file for complete search history.

(56) References Cited

U.S. PATENT DOCUMENTS 5,277,723 A * 1/1994 Kodama et al. ............ 156/89.15

FOREIGN PATENT DOCUMENTS

| JP | 7-30253 A | | 1/1995 |
|---|---|---|---|
| JP | 07030253 A | * | 1/1995 |
| JP | 11-21182 A | | 1/1999 |
| JP | 11021182 A | * | 1/1999 |
| JP | 2001-85839 A | | 3/2001 |
| JP | 2002-353624 A | | 12/2002 |
| JP | 2003-2750 A | | 1/2003 |
| JP | 2005-264246 A | | 9/2005 |
| JP | 2006173456 A | * | 6/2006 |
| JP | 2007-84368 A | | 4/2007 |

OTHER PUBLICATIONS

Official Communication issued in International Patent Application No. PCT/JP2009/052846, mailed on May 12, 2009.
Needes et al., "Constrained-sintered, Low-temperature Co-fired Ceramic for IC Packing Applications", Electronic Components and Technology Conference, 2003, vol. 53rd, pp. 30-35.

* cited by examiner

*Primary Examiner* — Mark A Osele
*Assistant Examiner* — Alex Efta
(74) *Attorney, Agent, or Firm* — Keating & Bennett, LLP

(57) ABSTRACT

A shrinkage suppression layer used in the production of a ceramic substrate according to a non-shrinkage process provides favorable removal performance while sufficiently ensuring the restraining performance of the shrinkage suppression layer. Resin beads, which disappear at a temperature lower than the sintering temperature of a low-temperature sintering ceramic material of a base material layer to form open bores in a shrinkage suppression layer, are added to the shrinkage suppression layer and dispersed uniformly at least in a principal surface direction. The shrinkage suppression layer provides sufficient restraining performance to the base material layer in the step of firing, and after the firing, forms open bores, thereby improving the removal performance of the shrinkage suppression layer.

9 Claims, 3 Drawing Sheets

PROCESS FOR PRODUCING CERAMIC SUBSTRATE

BACKGROUND OF THE INVENTION

1. Field of the Invention

The present invention relates to a process for producing a ceramic substrate, and more particularly, to a process for producing a ceramic substrate to which a non-shrinkage process is applied.

2. Description of the Related Art

In order to implement a method for producing a ceramic substrate according to a non-shrinkage process, an unfired composite laminate is produced and includes an unfired base material layer including, as its main component, a low-temperature sintering ceramic material, and a shrinkage suppression layer including, as its main component, a hard sinterable ceramic powder which is not substantially sintered at the sintering temperature of the low-temperature sintering ceramic material, in which the shrinkage suppression layer is provided on at least one principal surface of the base material layer.

Then, the unfired composite laminate is fired at the sintering temperature of the low-temperature sintering ceramic material, thereby providing a sintered ceramic substrate of the base material layer. In this firing step, the hard sinterable ceramic powder included in the shrinkage suppression layer is not substantially sintered, and thus, the shrinkage suppression layer does not substantially shrink. For this reason, the shrinkage suppression layer restrains the base material layer, thereby substantially shrinking the base material layer only in the thickness direction, while shrinkage in the principal surface direction is suppressed. As a result, non-uniform deformations are less likely to occur in the obtained ceramic substrate, and the accuracy of the shape and size in the planar direction of the ceramic substrate can be improved.

Next, the shrinkage suppression layer described above is removed, thereby extracting a ceramic substrate. It is to be noted that when a multilayer ceramic substrate is to be produced as the ceramic substrate, the unfired composite laminate described above includes a plurality of stacked base material layers.

In the method for producing a ceramic substrate according to the non-shrinkage process described above, the shrinkage suppression layer is required to have outstanding restraining performance in the step of firing and have excellent removal performance after the step of firing. Techniques relating to the removal performance of such a shrinkage suppression layer include, for example, a technique described in Japanese Patent Application Laid-Open No. 7-30253.

While the technique described in Japanese Patent Application Laid-Open No. 7-30253 is directly related to the removal performance of the shrinkage suppression layer, the technique promotes the removal of an organic binder in a base material layer in the process of firing, such that the removal of the organic binder in the base material layer via through holes is facilitated by applying a hole forming process to the shrinkage suppression layer, filling the numerous formed through holes with a resin paste having a decomposition temperature lower than the organic binder included in the base material layer, and thermally decomposing the resin in the through holes first in the step of firing. According to this technique described in Japanese Patent Application Laid-Open No. 7-30253, the effect of facilitating removal of the shrinkage suppression layer can also be expected because the numerous through holes are provided in the shrinkage suppression layer after the step of firing.

However, when the technique described in Japanese Patent Application Laid-Open No. 7-30253 is applied to try to form a shrinkage suppression layer which is easily removed after firing, the number of through holes formed in accordance with a hole forming process and the cross-sectional area of the through holes will be increased, which will lead to a decrease in the restraining performance provided by the shrinkage suppression layer.

In order to improve the restraining performance, the reactivity of the shrinkage suppression layer with the base material layer is preferably increased, and the rigidity of the shrinkage suppression layer itself is preferably increased. However, when the reactivity is increased and when the rigidity is also increased, the shrinkage suppression layer is not easily fractured in the step of removing the shrinkage suppression layer, and it is also difficult to peel the shrinkage suppression layer from the ceramic substrate, thus resulting in a decrease in removal performance. As described above, it is difficult for the shrinkage suppression layer to achieve a balance between restraining performance and removal performance.

Furthermore, when the technique described in Japanese Patent Application Laid-Open No. 7-30253 is used to try to improve the removal performance of the shrinkage suppression layer, it will be necessary to apply a hole forming process to the shrinkage suppression and fill the formed through holes with a resin paste, thus causing the production efficiency to be decreased.

SUMMARY OF THE INVENTION

To overcome the problems described above, preferred embodiments of the present invention provide, in relation to a process for producing a ceramic substrate via a non-shrinkage process, a method which improves the removal performance of a shrinkage suppression layer while sufficiently maintaining the restraining performance provided by the shrinkage suppression layer, without decreasing the production efficiency.

A preferred embodiment of the present invention is directed to a method for producing a ceramic substrate including the steps of producing an unfired composite laminate including an unfired base material layer including a low-temperature sintering ceramic material as its main constituent, and a shrinkage suppression layer including a hard sinterable ceramic powder as its main constituent, the hard sinterable ceramic powder not being substantially sintered at the sintering temperature of the low-temperature sintering ceramic material, in which the shrinkage suppression layer is provided on at least one principal surface of the base material layer, firing the unfired composite laminate at the sintering temperature of the low-temperature sintering ceramic material, thereby providing a ceramic substrate of the sintered base material layer, and removing the shrinkage suppression layer to extract the ceramic substrate.

In order to solve the technical problems described above, in that in the step of producing the unfired composite laminate, a solid open bore forming material is preferably added in advance which disappears in the step of firing to form open bores in the shrinkage suppression layer, wherein the solid open bore forming material is dispersed uniformly at least in the principal surface direction.

The uniformly dispersed state herein refers to a moderately dispersed state to such an extent that no undesirable deformation is caused in the step of pressure bonding. More specifically, while the open bore forming material preferably has exactly the same density at all portions in the principal surface direction, the open bore forming material may include portions having a relatively high density as long as no undesirable deformation is caused in the step of pressure bonding. For example, when binder removal is more difficult in a central section a relatively high density of the open bore forming material in the central portion may be preferable to facilitate binder removal.

The open bore forming material is preferably defined by resin beads, for example.

Typically, the shrinkage suppression layer includes a binder and the open bore forming material preferably disappears earlier than the binder in the step of firing. In this case, the open bore forming material is preferably an acrylic based resin, for example. In addition, the binder included in the shrinkage suppression layer is preferably a butyral based binder, for example.

In addition, the additive amount of the open bore forming material to the hard sinterable ceramic powder is preferably about 12 volume % to about 30 volume %, for example.

In addition, the open bore preferably has an inner diameter of about 5 μm to about 20 μm, for example.

Preferred embodiments of the present invention are advantageously applied, in particular, when the unfired composite laminate includes a plurality of stacked base material layers, that is, when a multilayer ceramic substrate is to be produced.

In addition, when the shrinkage suppression layer is provided in an inner layer region located on a side in contact with the base material layer and an outer layer region located on an outer surface side of the composite laminate, the additive amount of the open bore forming material is preferably greater in the outer layer region than in the inner layer region.

According to preferred embodiments of the present invention, open bores are formed in the shrinkage suppression layer by the disappearance of the open bore forming material. Since the open bore sections in the shrinkage suppression layer function as starting points of fracture, the shrinkage suppression layer can be easily fractured by ultrasonic cleaning or other suitable method. Therefore, the removal performance can be improved as compared to shrinkage suppression layers which provide comparable restraining performance, but which have no open bores.

In addition, at the stage of producing the unfired composite laminate prior to firing, the step of pressure bonding must to be applied to the composite laminate to attach the shrinkage suppression layer to the base material layer. In the structure described in Japanese Patent Application Laid-Open No. 7-30253 mentioned above, since the resin filled section and the other section in the shrinkage suppression layer differ from each other in terms of softness, an undesirable deformation may be produced on the base material layer side when the pressure bonding is performed. On the other hand, according to preferred embodiments of the present invention, the open bore forming material is solid and dispersed uniformly at least in the principal surface direction in the shrinkage suppression layer. Thus, the shrinkage suppression layer exhibits the same behavior in the principal surface direction in the step of pressure bonding, and undesirable deformation will not be produced in the base material layer.

In addition, since the open bore forming material is solid as described above, the size of the open bores formed with the use of the open bore forming material can be easily controlled. Therefore, from the standpoint of ease of removal of the shrinkage suppression layer, more effectively sized open bores can be formed in a reproducible manner.

In addition, the use of the resin beads for the open bore forming material enables a material that is readily available and easy to handle to be used for the open bore forming material.

In addition, the use of resin beads made of an acrylic based resin enables the other resin components, such as binder resins, for example, to be removed smoothly through open bores formed of the acrylic based resin, because the acrylic based resin starts to thermally decompose at relatively low temperatures.

In addition, when the resin beads made of an acrylic based resin and a butyral based binder are used respectively as the resin beads and the organic binder contained in the shrinkage suppression layer, the acrylic based resin disappears earlier as compared to the butyral based binder, thus allowing the butyral based binder to disappear smoothly through open bores formed by the disappearance of the resin beads. Therefore, the performance of binder removal can be improved.

When the additive amount of the open bore forming material to the hard sinterable ceramic powder is about 12 volume % to about 30 volume %, open bores that are distributed at the surface of the shrinkage suppression layer will be more likely to be formed after firing. The open bores formed at the surface as described above are more effective to function as starting points for fracturing the shrinkage suppression layer when the shrinkage suppression layer is removed. Therefore, the performance of removal of the shrinkage suppression layer can be improved.

When the additive amount of the open bore forming material in the shrinkage suppression layer is greater in the outer layer region on the outer surface side of the composite laminate than in the inner layer region on the side in contact with the base material layer, the removal performance can be improved in the outer layer region while sufficiently ensuring the restraining performance in the inner region. Thus, both the restraining performance and removal performance can be achieved at high levels.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
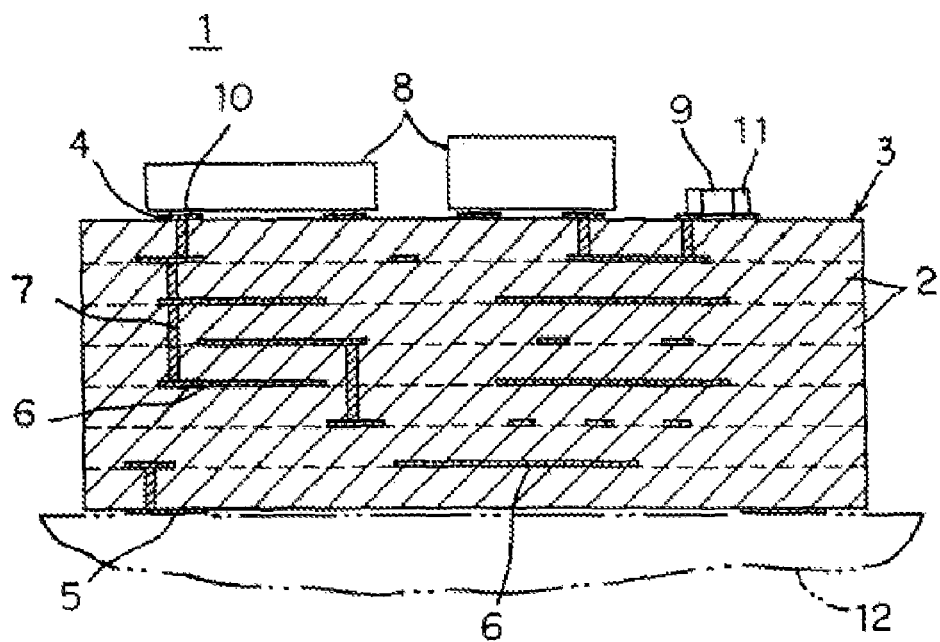
FIG. 1 illustrates a preferred embodiment of the present invention, which is a cross-sectional view illustrating a functional module 1 including a multilayer ceramic substrate 3 as an example of a ceramic substrate produced in accordance with a production method according to a preferred embodiment of the present invention.

FIG. 1 illustrates a preferred embodiment of the present invention, which is a cross-sectional view illustrating a functional module 1 including a multilayer ceramic substrate 3 as an example of a ceramic substrate produced in accordance with a production method according to a preferred embodiment of the present invention.

The multilayer ceramic substrate 3 includes a plurality of stacked ceramic layers 2. Various types of wiring conductors are provided on the ceramic layers 2.

The wiring conductors include several external conductor films 4 and 5 arranged on end surfaces of the multilayer ceramic substrate 3 in the stacking direction, several internal conductor films 6 arranged along the interfaces between the ceramic layers 2, and several via hole conductors 7 arranged to pass through specific ones of the ceramic layers 2.

The external conductive films 4 are arranged to be connected to electronic components 8 and 9 to be mounted on the outer surface of the multilayer ceramic substrate 3 in order to define the functional module 1. FIG. 1 shows the electronic components 8, such as a semiconductor device, for example, including bump electrodes 10, and the electronic component 9, such as a chip capacitor, for example, including a planar terminal electrode 11.

The electronic components 8 are bonded via the bump electrodes 10 to the external conductor film 4 preferably by applying a solder reflow process, an ultrasonic imparting process, or a thermocompression bonding process, for example, to the bump electrodes 10. On the other hand, the electronic component 9 is mounted on the multilayer ceramic substrate 3 preferably by bonding the terminal electrode 11 to the external conductor film 4 with the use of, for example, solder or an electrically conductive adhesive with the surface of the terminal electrode 11 opposed to the external conductor film 4.

In addition, the external conductor film 5 is arranged to be connected to a motherboard 12 for mounting the functional module 1 thereon, as shown by an imaginary line in FIG. 1. More specifically, the functional module 1 is preferably mounted onto the motherboard 12 with the functional module 1 electrically connected through the external conductor film 5, thereby defining a desired electronic apparatus.

Figure 2:
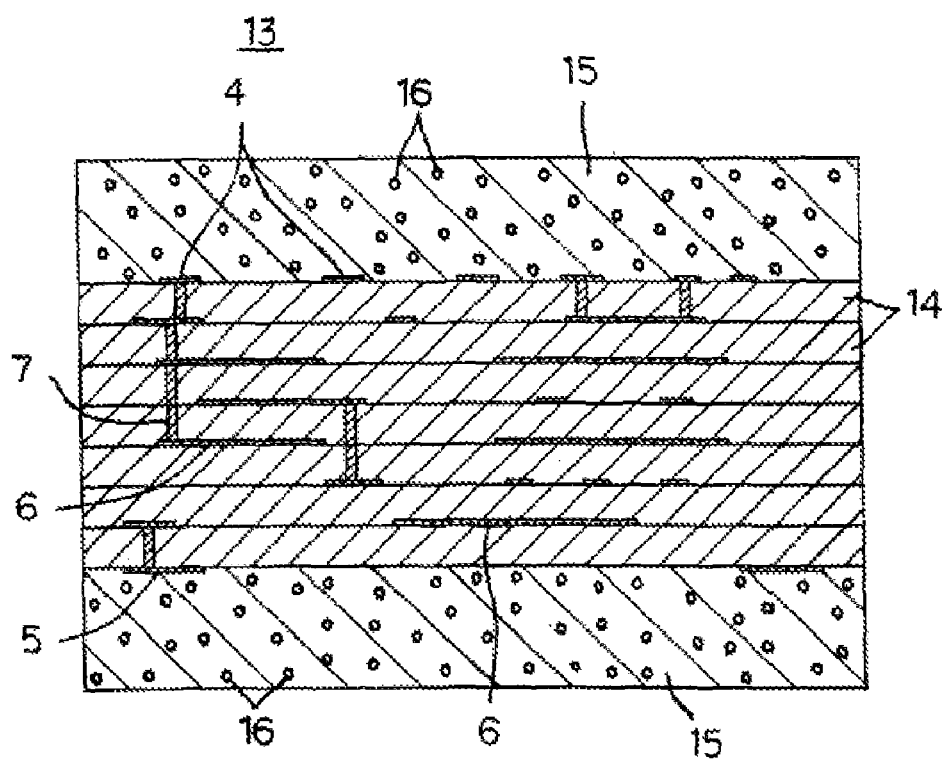
FIG. 2 is a cross-sectional view illustrating an unfired composite laminate 13 prepared for obtaining the multilayer ceramic substrate 3 shown in FIG. 1.

The multilayer ceramic substrate 3 shown in FIG. 1 is obtained by firing an unfired composite laminate 13 as shown in FIG. 2.

The unfired composite laminate 13 includes a plurality of stacked unfired base material layers 14. The base material layers 14 are fired to define the ceramic layers 2. The external conductor films 4 and 5, the internal conductor films 6, and the via hole conductors 7 are provided on the base material layers 14.

The unfired base material layers 14 preferably include a low-temperature sintering ceramic material and a binder. The low-temperature sintering ceramic material refers to a ceramic material which is able to be sintered at a temperature of about 1050° C. or less and fired simultaneously with silver, copper, or other suitable material, for example, which has a relatively small specific resistance.

The low-temperature sintering ceramic material preferably includes glass composite based low-temperature sintering ceramic materials of ceramic powder, such as alumina, zirconia, magnesia, and forsterite, mixed with borosilicate based glass; crystallized glass based low-temperature sintering ceramic materials using $ZnO$—$MgO$—$Al_2O_3$—$SiO_2$ based crystallized glass; and non-glass low-temperature sintering ceramic materials using $BaO$—$Al_2O_3$—$SiO_2$ based ceramic powder or $Al_2O_3$—$CaO$—$SiO_2$—$MgO$—$B_2O_3$ based ceramic powder, for example.

In addition, the unfired composite laminate 13 further includes a shrinkage suppression layer 15 provided on at least one principal surface of the laminate structure including the plurality of stacked base material layers 14. In this preferred embodiment, the shrinkage suppression layer 15 is preferably provided on both of the principal surfaces of the laminate structure including the plurality of stacked base material layers 14.

The shrinkage suppression layer 15 includes a hard sinterable ceramic powder which is not substantially sintered at the sintering temperature of the low-temperature sintering ceramic material, and preferably includes resin beads as a solid open bore forming material, a solvent, an organic binder, a dispersant, and a plasticizer, for example. In FIG. 2, while resin beads 16 are shown schematically, the resin beads 16 are uniformly or substantially uniformly dispersed in the shrinkage suppression layer 15. Further, as described below, the resin beads 16 are only required to be dispersed uniformly in at least the principal surface direction in the shrinkage suppression layer 15.

As the hard sinterable ceramic powder, powders such as, for example, alumina, zirconia, magnesia, and forsterite can preferably be used.

In addition, as the resin beads 16, for example, resin beads made from a cellulosic resin or an acrylic based resin can preferably be used, and the use of resin beads made from an acrylic based resin is more preferable. This is because the acrylic based resin starts to thermally decompose at relatively low temperatures, and the use of the resin beads 16 made from an acrylic based resin allows the other resin components, such as organic binders, to be removed smoothly in the step of firing through open bores formed by thermal decomposition of the resin beads 16. Further, the resin used for the resin beads 16 must not dissolve in the solvent included in the shrinkage suppression layer 15.

As described above, when using resin beads made from an acrylic based resin as the resin beads 16, it is preferable to use a butyral based binder, for example, as the organic binder included in the shrinkage suppression layer 15. This is because the use of such a composition causes the acrylic based resin to disappear earlier in the step of firing, thus allowing the butyral based binder to disappear smoothly through open bores formed with the use of the resin beads 16 so as to improve the performance of the binder removal.

It is preferable that the open bore forming material disappear earlier than the binder in the step of firing. Therefore, in addition to using an acrylic based resin and a butyral based binder as the open bore forming material and the binder as described above, the open bore forming material can be caused to disappear earlier than the binder, for example, by adjusting the disappearance onset temperature between the resin used as the open bore forming material and the resin for the binder while using a butyral based resin or an acrylic based resin for both the open bore forming material and the binder.

Further, it is to be noted that other materials can also be used for the open bore forming material included in the shrinkage suppression layer 15 as long as the materials can form open bores in the fired shrinkage suppression layer 15.

The shrinkage suppression layer 15 preferably has a thickness of about 50 μm to about 500 μm, for example. In addition, the hard sinterable ceramic powder preferably has an average grain diameter of about 0.2 μm to about 1 μm, for example. When the thickness of the shrinkage suppression layer 15 is relatively large, and when the hard sinterable ceramic powder has a relatively small average grain diameter, a larger restraining force can be exerted, while the removal performance for the shrinkage suppression layer 15 is decreased. According to a preferred embodiment of the present invention, the open bore forming material, such as the resin beads 16, is included in the shrinkage suppression layer 15 so as to improve the removal performance for the shrinkage suppression layer 15. Thus, the range of thicknesses of the shrinkage suppression layer 15 and range of the average grain diameter of the hard sinterable ceramic powder can be increased.

In order to produce the unfired composite laminate 13 as described above, the following steps are performed.

First, in order to obtain the unfired base material layers 14, a binder, a dispersant, a plasticizer, and an organic solvent, for example, are preferably added in appropriate amounts to the low-temperature sintering ceramic material powder, and these components are mixed to produce a ceramic slurry. Then, this ceramic slurry is formed into a sheet shape by a doctor blade method or other suitable method, for example, to obtain ceramic green sheets for base materials defining the unfired base material layers 14.

Then, the obtained ceramic green sheets for base materials are provided with a through open bore for the formation of the via hole conductor 7, if necessary, and this through open bore is filled with a conducive paste or a conductor powder to form the via hole conductor 7. In addition, if necessary, a conductive paste is printed onto the ceramic green sheets to form the external conductor films 4 and 5 and the internal conductive film 6. As the conductor defining a conductor component or a conductor powder included in the conductive paste, a conductor including a low melting point metal such as silver, copper, and gold as its main constituent, or an alloy of the low melting point metal with palladium, platinum, or other suitable material, for example, included in the low melting point metal is preferably used.

Then, these ceramic green sheets are stacked in predetermined order.

In order to obtain the shrinkage suppression layer 15, a solvent, an organic binder, a dispersant, and a plasticizer, for example, are preferably added each in appropriate amounts to hard sinterable ceramic powder preferably made of alumina or other suitable material, for example, to which the resin beads 16 are added, and these components are mixed to produce a hard sinterable ceramic slurry. Then, this hard sinterable ceramic slurry is formed into a sheet shape by a doctor blade method or other suitable method, for example, to obtain ceramic green sheets used to form the shrinkage suppression layer 15.

Next, the ceramic green sheet for shrinkage suppression is stacked and pressed on the top and bottom of the laminate structure including the stacked ceramic green sheets used for the base materials. This step provides the unfired composite laminate 13 as shown in FIG. 2. It is to be noted that, if necessary, this unfired composite laminate 13 may be cut into an appropriate size.

In order to obtain the multilayer ceramic substrate 3 from the unfired composite laminate 13, the unfired composite laminate 13 is fired at a temperature, for example, on the order of about 800° C. to about 1000° C. In this firing step, the shrinkage suppression layer 15 does not substantially shrink. Therefore, the shrinkage suppression layer 15 exerts a restraining force on the base material layers 14 to suppress shrinkage of the base material layers 14 in the principal surface direction, thereby sintering the low-temperature sintering ceramic material included in the base material layers 14 while suppressing shrinkage of the base material layers 14 in the principal surface direction, shrinking the base material layers 14 substantially only in the thickness direction, and forming the ceramic layers 2 in the multilayer ceramic substrate 3.

Figure 3:
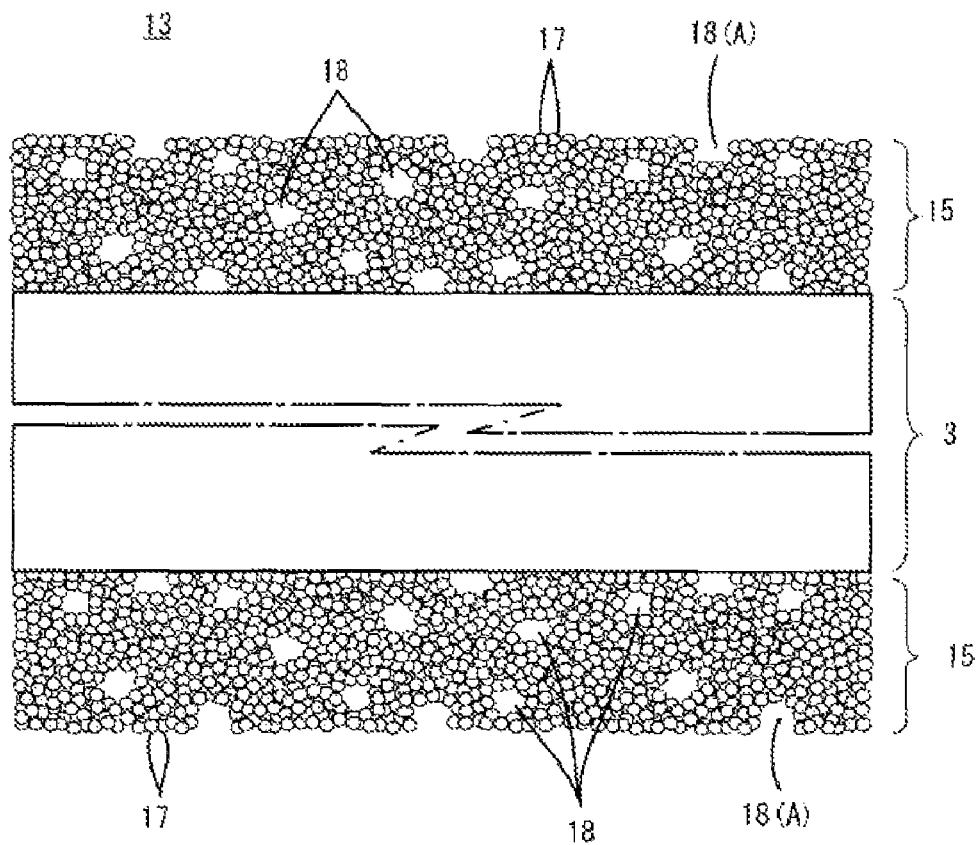
FIG. 3 is a cross-sectional view illustrating the fired composite laminate 13.

In addition, in the step of firing, the resin beads 16 disappear, thereby forming open bores in the shrinkage suppression layer 15. FIG. 3 is a cross-sectional view illustrating the fired composite laminate 13. FIG. 3 shows the sintered multilayer ceramic substrate 3 and a hard sinterable ceramic powder 17 as a main component for the shrinkage suppression layer 15. In addition, in the shrinkage suppression layer 15, open bores 18 formed as a result of the disappearance of the resin beads 16 are shown. Among these open bores 18, the open bores located at the surface of the shrinkage suppression layer 15 are denoted by a reference numeral 18(A).

Next, the shrinkage suppression layer 15 is removed. The removal of the shrinkage suppression layer 15 can be easily performed for the following reasons.

First, because the shrinkage suppression layer 15 is not sintered, the shrinkage suppression layer 15 can be easily removed.

In addition, the shrinkage suppression layer 15 has open bores 18 formed therein, and thus is likely to be fractured. Therefore, the shrinkage suppression layer 15 can be easily removed.

Furthermore, since the shrinkage suppression layer 15 includes the open bores 18(A) formed at the surface thereof, the shrinkage suppression layer 15 can be easily removed with the open bores 18(A) at the surface functioning as starting points of fracture. It is to be noted that in order to facilitate the formation of these open bores 18(A) at the surface, the additive amount of the resin beads 16 to the hard sinterable ceramic powder 17 is preferably selected within the range of about 12 volume % to about 30 volume %, for example.

The open bore 18 preferably has an inner diameter of about 5 μm to about 20 μm, for example, and the average grain diameter of the resin beads 16 is selected to achieve the inner diameter of the open bore 18. If the inner diameter of the open bore 18 is less than about 5 μm, then the removal performance for the shrinkage suppression layer 15 tends to be decreased. On the other hand, if the inner diameter of the open bore 18 is greater than about 20 μm, then the restraining force exerted by the shrinkage suppression layer 15 will be decreased so as to cause warpage or heave in the multilayer ceramic substrate 3.

It is to be noted that resin beads 16 as the open bore forming material are included only in the shrinkage suppression layer 15, and are not included in the base material layers 14. This composition provides the following advantages. The multilayer ceramic substrate 3 having a low profile has a serious problem of decreased strength, which is caused by open bores 18 formed with the use of the resin beads 16. However, since the resin beads 16 are not provided in the base material layers 14, the problem of a decrease in the strength of the multilayer ceramic substrate 3 does not occur.

The multilayer ceramic substrate 3 shown in FIG. 1 is obtained as described above. When the electronic components 8 and 9 are mounted on the outer surface of the multilayer ceramic substrate 3, the functional module 1 is completed as shown in FIG. 1.

Next, experimental examples will be described which were conducted to confirm the advantageous effects of preferred embodiments of the present invention.

First, in order to produce ceramic green sheets for base materials to be used as base material layers, $CaO-Al_2O_3-SiO_2-B_2O_3$ based glass and alumina powder were prepared to provide a predetermined ratio, and to these components, a solvent, a dispersant, an organic binder, and a plasticizer were added and mixed sufficiently, thereby providing a ceramic slurry for base materials. Then, a doctor blade method was applied to the ceramic slurry for base materials to produce ceramic green sheets for base materials.

In order to produce a ceramic green sheet for shrinkage suppression to be used as a shrinkage suppression layer, alumina powder with an average grain diameter D50 of about 0.4 μm and resin beads with an average grain diameter D50 of about 10 μm made of an acrylic based resin were prepared. Then, while changing the additive amount of resin beads to the alumina powder as shown in Table 1, the resin beads were added to the alumina powder, and a solvent, a dispersant, an organic binder, and a plasticizer were added and mixed sufficiently, thereby providing a ceramic slurry for shrinkage suppression. Then, a doctor blade method was applied to the ceramic slurry for shrinkage suppression to produce ceramic green sheets for shrinkage suppression.

In addition, a silver powder, a solvent, and an organic binder were mixed at a predetermined ratio, and this mixture was subjected to a dispersion treatment in a triple roll mill, thereby providing a conductive paste containing silver as a conductive component.

Next, a conductive paste was applied by screen printing onto the above-described ceramic green sheets for base materials to form conductor films in predetermined patterns, the multiple ceramic green sheets for base materials were then stacked. Furthermore, the ceramic green sheets for shrinkage suppression were stacked on the both sides in the stacking direction, and the stack in this condition was pressed in the stacking direction to obtain an unfired composite laminate. It is to be noted that in the unfired composite laminate, the ceramic green sheet section for shrinkage suppression had a thickness of about 200 μm on each side, whereas the section of the stacked ceramic green sheets for base materials had a thickness of about 1000 μm.

Next, the unfired composite laminate was fired in accordance with a predetermined temperature profile to obtain a multilayer ceramic substrate as a sample. After the firing, ultrasonic cleaning was performed in order to remove the shrinkage suppression layers, and the condition after the removal of the shrinkage suppression layers was evaluated.

More specifically, an ultrasonic cleaning machine (from Sharp Corporation, UT-205S) was used to clean the multilayer ceramic substrate at the maximum output of about 200 W (35 kHz). With the use of ion-exchange water for the cleaning water, this ion-exchange water was filled to the upper limit water level indication line (about 8.6 L) of the system, and used. The ultrasonic cleaning was performed for a predetermined period of time, and the removal rate of the shrinkage suppression layers was obtained.

The removal rate was obtained by the following equation:

Removal Rate [%]=(Amount of Decrease in Weight by Ultrasonic Cleaning)/(Initial Weight of Shrinkage Suppression Layer)×100, where the "Amount of Decrease in Weight by Ultrasonic Cleaning" was obtained from the weight of the dried sample subjected to drying at a temperature of about 100° C. for about 30 minutes after the ultrasonic cleaning.

The "removal rate" in Table 1 refers to a removal rate obtained after performing ultrasonic cleaning for about 10 minutes.

Figure 4:
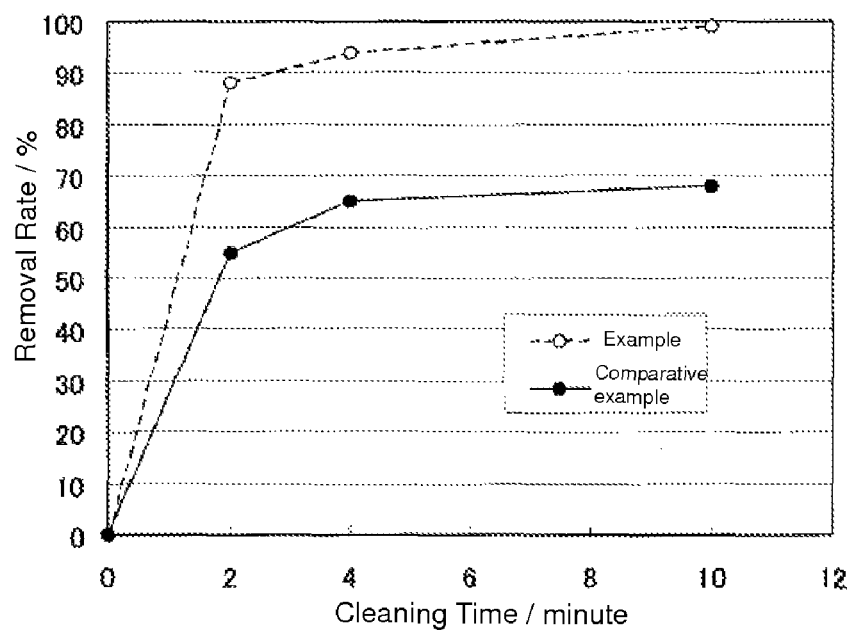
FIG. 4 is a diagram showing the relationship between the ultrasonic cleaning time and the removal rate of the shrinkage suppression layer for sample 1 (comparative example) and sample 4 (example) produced in experimental examples.

In addition, FIG. 4 shows the relationship between the cleaning time and the removal rate, where the sample 1 shown in Table 1 is represented as "comparative example" and the sample 4 shown therein is represented as "example".

In addition, in order to evaluate the restraining performance provided by the shrinkage suppression layer, the amount of warpage was measured after firing the multilayer ceramic substrates as samples. The results are shown in the column "Amount of Warpage" in Table 1.

TABLE 1

| Sample Number | Additive Amount of Resin Beads/ volume % | Removal Rate/% | Amount of Warpage/μm |
| --- | --- | --- | --- |
| 1 | 0 | 68 | 120 |
| 2 | 7 | 92 | 130 |
| 3 | 12 | 99 | 140 |
| 4 | 20 | 99 | 160 |
| 5 | 30 | 99 | 180 |
| 6 | 40 | 99 | 220 |
| 7 | 50 | 100 | 350 |

When the removal rate after cleaning for 10 minutes is about 98% or more, the shrinkage suppression layer can be removed perfectly or almost perfectly by spending a little more time for the ultrasonic cleaning. In this regard, the samples 3 to 7 provide removal rates of about 98% or more. On the other hand, when considering the amount of warpage, the samples 6 and 7 show that the amount of warpage is greater than about 200 μm, and it is thus determined for the samples 6 and 7 that the restraining performance provided by the shrinkage suppression layer is not sufficient. On the other hand, the samples 1 to 5 show that the amount of warpage is less than about 200 μm, and it is thus determined for the samples 1 to 5 that the shrinkage suppression layer exerts sufficient restraining performance.

In view of both the removal rate and the amount of warpage, it is determined that the samples 3 to 5 show favorable results, and that the additive amount of the resin beads to the alumina powder is preferably selected within the range of about 12 volume % to about 30 volume %.

Figure 5:
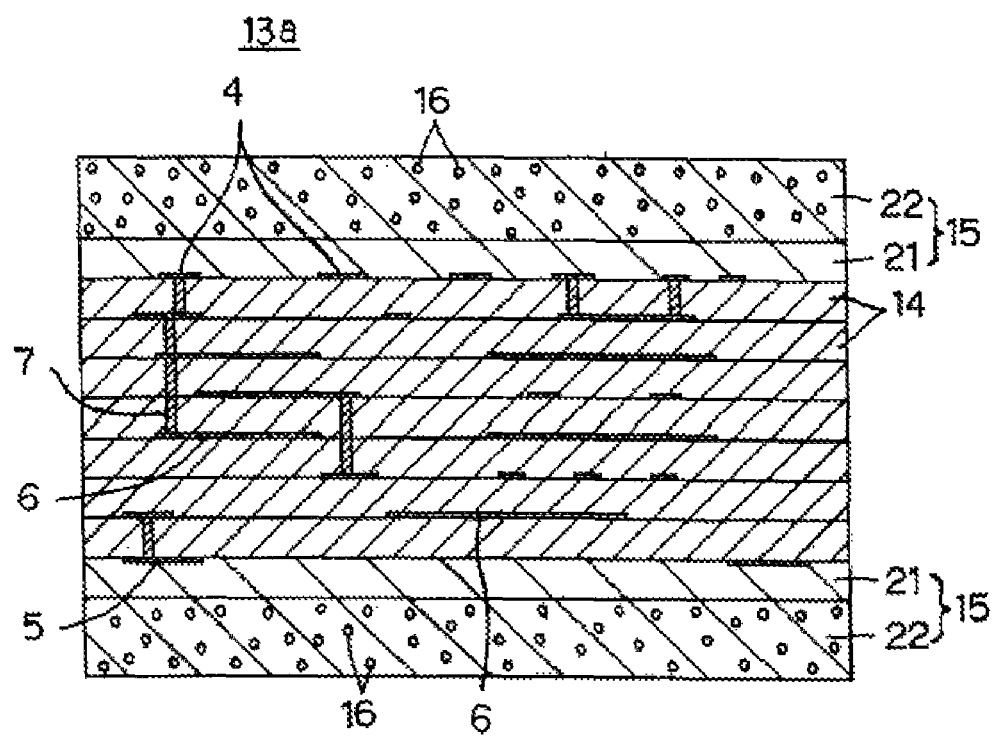
FIG. 5 illustrates another preferred embodiment according to the present invention.

FIG. 5 is a diagram corresponding to FIG. 2 showing another preferred embodiment according to the present invention. In FIG. 5, elements corresponding to the elements shown in FIG. 2 are denoted by the same reference numerals, and the repeated description will be omitted.

In the preferred embodiment shown in FIG. 5, an unfired composite laminate 13a includes a shrinkage suppression layer 15 that is divided into an inner layer region 21 located on the side in contact with a base material layer 14 and an outer layer region 22 located on the outer surface side of the composite laminate 13a, the additive amount of the resin beads 16 is greater in the outer layer region 22 than in the inner layer region 21. Even in this case, the resin beads 16 are dispersed uniformly or substantially uniformly in the principal surface direction of the shrinkage suppression layer 15.

It is to be noted that while the resin beads 16 are shown as being dispersed only in the outer layer region 22 in FIG. 5, the resin beads 16 are dispersed in both the inner layer region 21 and the outer layer region 22 such that the additive amount of the resin beads 16 in the outer layer region 22 is greater than the additive amount of the resin beads 16 in the inner layer region 21. In addition, rather than including two regions, such as the inner layer region 21 and the outer layer region 22, at least one intermediate region may be provided between the inner layer region 21 and the outer layer region 22, and the three or more regions may have a graded structure in which the additive amount of the resin beads 16 is graded.

According to the preferred embodiment shown in FIG. 5, while the inner layer region 21 in the shrinkage suppression layer 15 ensures sufficient restraining performance, the outer layer region 22 improves the removal performance. Thus, both the restraining performance and removal performance can be achieved at high levels.

While the present invention has been described in conjunction with the preferred embodiments shown in the drawings, other various modified examples are possible within the scope of the present invention.

For example, while the methods for producing a multilayer ceramic substrate as a ceramic substrate have been described in the preferred embodiment shown in the drawings, the present invention can also be applied to methods for producing a single layer ceramic substrate, without limitation to multilayer ceramic substrates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a ceramic substrate comprising the steps of:
    producing an unfired composite laminate comprising an unfired base material layer including a low-temperature sintering ceramic material as a main component and a shrinkage suppression layer including a hard sinterable ceramic powder as a main component, the hard sinterable ceramic powder not being substantially sintered at a sintering temperature of the low-temperature sintering ceramic material, the shrinkage suppression layer being provided on at least one principal surface of the base material layer;
    firing the unfired composite laminate at the sintering temperature of the low-temperature sintering ceramic material, thereby providing a ceramic substrate of the sintered base material layer; and
    removing the shrinkage suppression layer to extract the ceramic substrate; wherein
    in the step of producing the unfired composite laminate, a solid open bore forming material is added in the shrinkage suppression layer, the solid open bore forming material disappears in the step of firing to form open bores in the shrinkage suppression layer, the solid open bore forming material being uniformly or substantially uniformly dispersed at least in the principal surface direction of the shrinkage suppression layer; and
    none of the open bores extends entirely through the shrinkage suppression layer.

2. The method for producing a ceramic substrate according to claim 1, wherein the open bore forming material includes resin beads.

3. The method for producing a ceramic substrate according to claim 1, wherein the shrinkage suppression layer comprises a binder, and the open bore forming material disappears earlier than the binder in the step of firing.

4. The method for producing a ceramic substrate according to claim 3, wherein the open bore forming material comprises an acrylic based resin.

5. The method for producing a ceramic substrate according to claim 4, wherein the binder included in the shrinkage suppression layer is a butyral based binder.

6. The method for producing a ceramic substrate according to claim 1, wherein an additive amount of the open bore forming material to the hard sinterable ceramic powder is about 12 volume % to about 30 volume %.

7. The method for producing a ceramic substrate according to claim 1, wherein the open bore has an inner diameter of about 5 μm to about 20 μm.

8. The method for producing a ceramic substrate according to claim 1, wherein the unfired composite laminate includes a plurality of stacked base material layers.

9. The method for producing a ceramic substrate according to claim 1, wherein the shrinkage suppression layer includes an inner layer region located on a side in contact with the base material layer and an outer layer region located on an outer surface side of the composite laminate, and an additive amount of the open bore forming material is greater in the outer layer region than in the inner layer region.

* * * * *